United States Patent
Kaul et al.

(10) Patent No.: US 7,313,776 B2
(45) Date of Patent: Dec. 25, 2007

(54) METHOD AND APPARATUS FOR ROUTING AN INTEGRATED CIRCUIT

(75) Inventors: Neeraj Kaul, Fremont, CA (US); Balkrishna Rashingkar, San Jose, CA (US); Anthony Y. Tseng, Bellevue, WA (US); Wei-Chih Tseng, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 263 days.

(21) Appl. No.: 11/169,362

(22) Filed: Jun. 28, 2005

(65) Prior Publication Data

US 2006/0294485 A1 Dec. 28, 2006

(51) Int. Cl.
*G06F 17/50* (2006.01)
(52) U.S. Cl. .................. 716/10; 716/12; 716/13; 716/14
(58) Field of Classification Search .............. 716/10, 716/12–14
See application file for complete search history.

(56) References Cited

U.S. PATENT DOCUMENTS

| 5,784,289 A * | 7/1998 | Wang .................... 716/8 |
| 2002/0087940 A1* | 7/2002 | Greidinger et al. ........... 716/2 |
| 2003/0009734 A1* | 1/2003 | Burks et al. .................. 716/6 |

* cited by examiner

*Primary Examiner*—Stacy A Whitmore
*Assistant Examiner*—Magid Y. Dimyan
(74) *Attorney, Agent, or Firm*—Park, Vaughn & Fleming LLP; Gilbert Wong

(57) ABSTRACT

A system that routes nets within an integrated circuit. During operation, the system receives a representation for the integrated circuit, which includes block boundaries for physical partitions of the IC generated from a hierarchical design placement of the integrated circuit. The system then classifies each net in the integrated circuit based on the location of pins associated with the net. Next, the system generates routing constraints for each net based on the classification of the net and applies a feedthrough constraint to the physical partitions to restrict nets from feeding through physical partition boundaries. Finally, the system routes each net using the routing constraints for the net and the feedthrough constraints for the physical partitions. This routing is performed based on these block boundaries prior to finalizing the hierarchical design placement, thereby facilitating early detection of congestion or timing violations which can be corrected early in the design process.

18 Claims, 15 Drawing Sheets

METHOD AND APPARATUS FOR ROUTING AN INTEGRATED CIRCUIT

BACKGROUND

1. Field of the Invention

The present invention relates to techniques for routing an integrated circuit. More specifically, the present invention relates to a physical partition-aware routing technique for routing signal lines through an integrated circuit.

2. Related Art

Advances in semiconductor technology presently make it possible to integrate large-scale systems, including tens of millions of transistors, onto a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

As integrated circuit (IC) designers incorporate more system components onto a single IC chip, the complexity of the corresponding IC designs increases. In order to deal with this increased complexity, IC designers typically use "hierarchical" design techniques. During the hierarchical design process, the IC designer initially determines soft physical boundaries, called "physical partitions," between circuit elements in the design based on hierarchical design placement. Unfortunately, traditional global routing techniques do not report congestion in top-level channels or within physical partitions accurately because they do not understand physical partition boundaries during the initial hierarchical design stage. Furthermore, since pin locations are typically not finalized until later in the design cycle, a poor choice of pin location later in the design cycle can result in long inter-block wires that can cause timing violations which may not be detected until these blocks are finalized.

FIG. 1A illustrates an exemplary partitioning of a layout. It contains chip 100, physical partitions 102, 104, 106, 108, 110, 112, and 114. Note that top-level channels exist between the physical partitions. FIG. 1B illustrates an exemplary partitioning of a layout showing top-level channel congestion. It contains the same elements as FIG. 1A as well as top-level channel congestion 116, 118, 120, 122, and 124. Note that the IC designer receives accurate congestion analysis in the top-level channels and within physical partitions only after finalizing the hierarchical design placement and performing pin assignment on these partitions.

FIG. 2A illustrates a route for a net generated by a traditional global router prior to finalizing hierarchical design. It contains chip 200, partitions 202, 204, and 206, net 208, leaf-level pins 212 and 222, and partition boundary crossings 214, 216, 218, and 220. In one embodiment of the present invention, the system restricts nets from feeding through partition 206. A traditional global router, which does not account for physical partition boundaries and feedthrough constraints during the initial hierarchical design stage, can route net 208 from leaf-level pin 212 to leaf-level pin 222 through partition 206 crossing partition 206 at partition boundary crossings 216 and 218.

FIG. 2B illustrates a route for a net using a traditional global router after finalizing hierarchical design. It contains the same chip 200, partitions 202, 204, and 206, leaf-level pins 212 and 222, and partition boundary crossings 214 and 220 as FIG. 2A, as well as net 210. After the IC designer finalizes the hierarchical design placement, the traditional global router applies the feedthrough constraint of partition 206 and restricts the router from routing net 208 through partition 206, and generates net 210 to connect leaf-level pins 212 and 222. Note that, net 210 only crosses two partitions at partition boundary crossings 214 and 220.

If the IC designer performs congestion analysis on chip 200 during the initial hierarchical design stage after using a traditional global router, the analysis may not report congestion in the top-level channel because the router connects leaf-level pins 212 and 222 through partition 206. After finalizing hierarchical design placement and using the feedthrough constraint over partition 206, the router connects leaf-level pins 212 and 222 using the top-level channel instead of routing over partition 206. Since this new net uses the top-level channel, it may occupy a routing channel already used by another net, thereby causing previously undetected congestion. This congestion can require the IC designer to restart the design process and redo the hierarchical design placement. Therefore, it is desirable for the router to respect any constraints on the routing of nets early in the design process.

FIG. 4 presents a flow chart illustrating a traditional hierarchical design flow. The process begins when the system reads a netlist (step 402). Next, the system generates a hierarchical design placement, which involves placing cells and generating partitions. At this step, the design placement is not a final design placement. Next the design placement is used to check for congestion and timing violations. The system then performs global routing (step 406). Next, the system checks to see if there is congestion (step 408). If there is congestion, the system returns to hierarchical design placement to generate a new placement (step 404). If there are no congestion violations, the system performs in-place optimization (step 410). Next, the system checks for timing violations (step 412). If there is a timing violation, the system returns to hierarchical design placement to generate a new placement (step 404). Otherwise, the system finalizes the hierarchical design placement (step 414).

After finalizing the hierarchical design placement, the system performs block-level and top-level routing (step 416). The system then checks for congestion (step 418). If there is congestion, the system returns to hierarchical design placement (step 404). Otherwise, the system performs in-place optimization (step 420). The system then checks for timing violations (step 422). If there are timing violations, the system returns to hierarchical design placement to generate a new placement (step 404). Otherwise, it performs time budgeting, clock-tree-synthesis (CTS), and detailed block and top-level routing (step 424).

Note that since a traditional global router does not account for the physical partition boundaries while operating during the initial hierarchical design stage, the congestion and timing analysis modules do not report accurate information about these violations during the initial hierarchical design stage. Consequently, the system typically proceeds to the next design flow step even if potential congestion or timing violations exist; these violations will be found in a later design stage. The IC designer obtains accurate congestion and timing analyses only after finalizing the hierarchical design placement (step 414).

Therefore, in order to fix the congestion and timing violations, the IC designer may need to iterate between the initial hierarchical design placement stage, which involves floorplanning and partitioning, and the final hierarchical design placement stage, which involves pin assignment and placement of cells within the partition. Unfortunately, this process is costly and may take a long time to converge.

Hence, what is needed is a method and an apparatus to route nets for an integrated circuit design without the problems described above.

SUMMARY

One embodiment of the present invention provides a system that routes nets within an integrated circuit. During operation, the system receives a representation for the integrated circuit, which includes block boundaries for physical partitions of the integrated circuit generated from a hierarchical design placement of the integrated circuit. The system then classifies each net in the integrated circuit based on the location of pins associated with the net. (Note that pins are locations where the net is coupled to leaf-level circuit elements) Next, the system generates routing constraints for each net based on the classification of the net and applies a feedthrough constraint to the physical partitions to restrict nets from feeding through physical partition boundaries. Finally, the system routes each net using the routing constraints for the net and the feedthrough constraints for the physical partitions. This routing is performed based on these block boundaries prior to finalizing the hierarchical design placement, thereby facilitating early detection of congestion or timing violations which can be corrected early in the design process.

In a variation on this embodiment, the classifications for the net includes: a physical-partition-internal net, wherein all pin locations for the net are within a block boundary of the physical partition; a top-level net, wherein all pin locations for the net are within a top-level physical partition boundary; and a physical-partition-interface net, wherein at least one pin location for the net is located in a different physical partition boundary than other pins for the net.

In a variation on this embodiment, in order to route each net using the feedthrough constraint, the system determines if the net is a physical-partition-internal net, a top-level net, or a physical-partition-interface net. If the net is a physical-partition-internal net, the system routes the net so that the net remains within the block boundary of the physical partition. If the net is a top-level net, the system routes the net so that the net remains within the top-level physical partition boundary. If the net is a physical-partition-interface net, the system partitions the pins of the physical-partition-interface nets such that each pin is in a subset of pins, wherein after routing each subset of pins, the resulting net is: a physical-partition-internal net or a top-level net. The system then routes each subset of pins to form a subset of nets and routes the subset of nets to each other such that the number of crossings on the physical partition boundary equals the number of logical ports on the physical partition boundary. Note that routing each subset of pins involves routing the pins based on whether the net is a physical-partition-internal net or a top-level net.

In a variation on this embodiment, the feedthrough constraint prevents the routing of nets through part of or all of the physical partition. Moreover, the feedthrough constraint only applies to top-level nets and interface nets.

In a variation on this embodiment, the system applies a feedthrough constraint to all nets, not just top-level nets and physical-partition-interface nets.

In a variation on this embodiment, after routing the nets, the system determines if there is wire congestion and/or if there are timing violations in the current design for the integrated circuit. If there is wire congestion or if there are timing violations, the system generates a new floorplan, a new hierarchical design placement, and new block boundaries for physical partitions. The system then reroutes the nets using the new block boundaries for physical partitions.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Physical-Hierarchy-Aware Design Flow

Figure 1A:
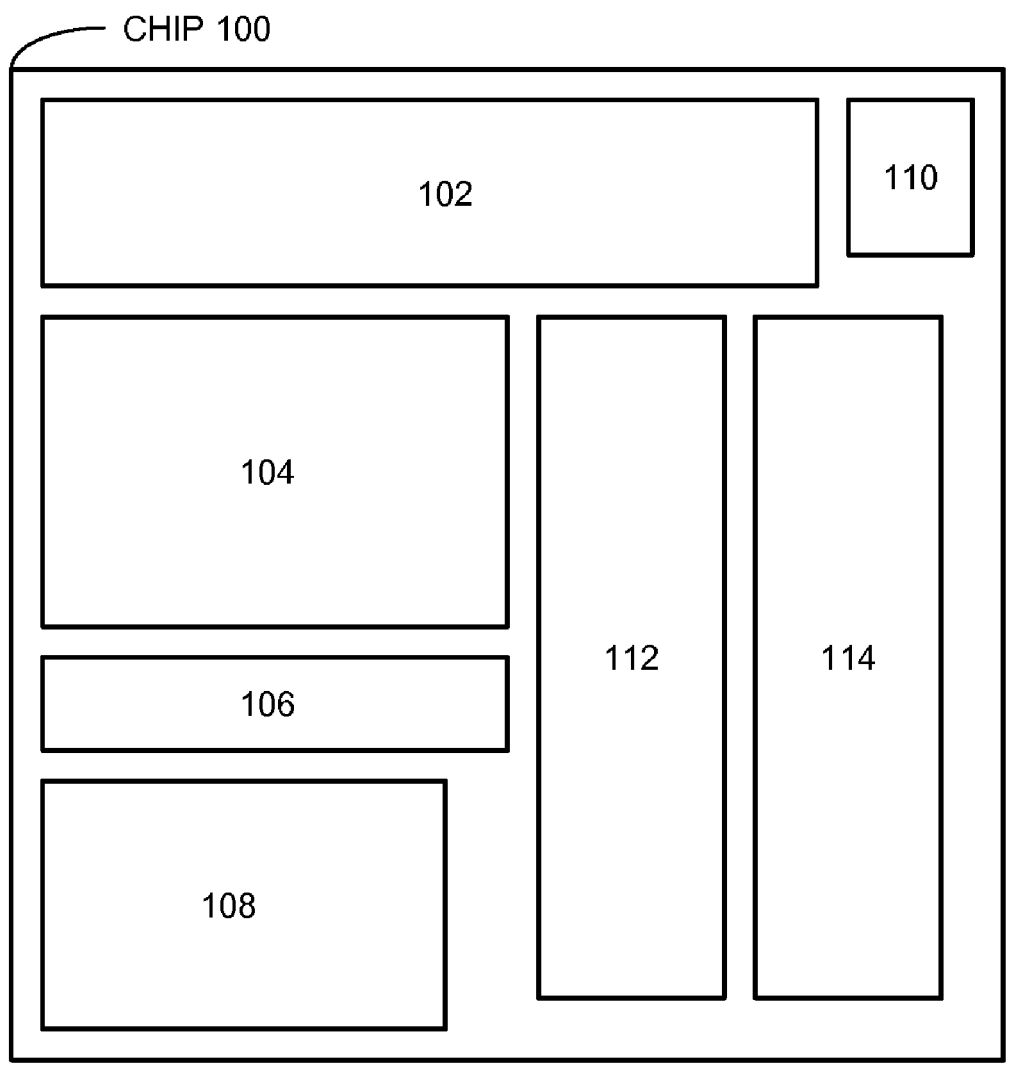
FIG. 1A illustrates an exemplary partitioning of a layout.
Figure 1B:
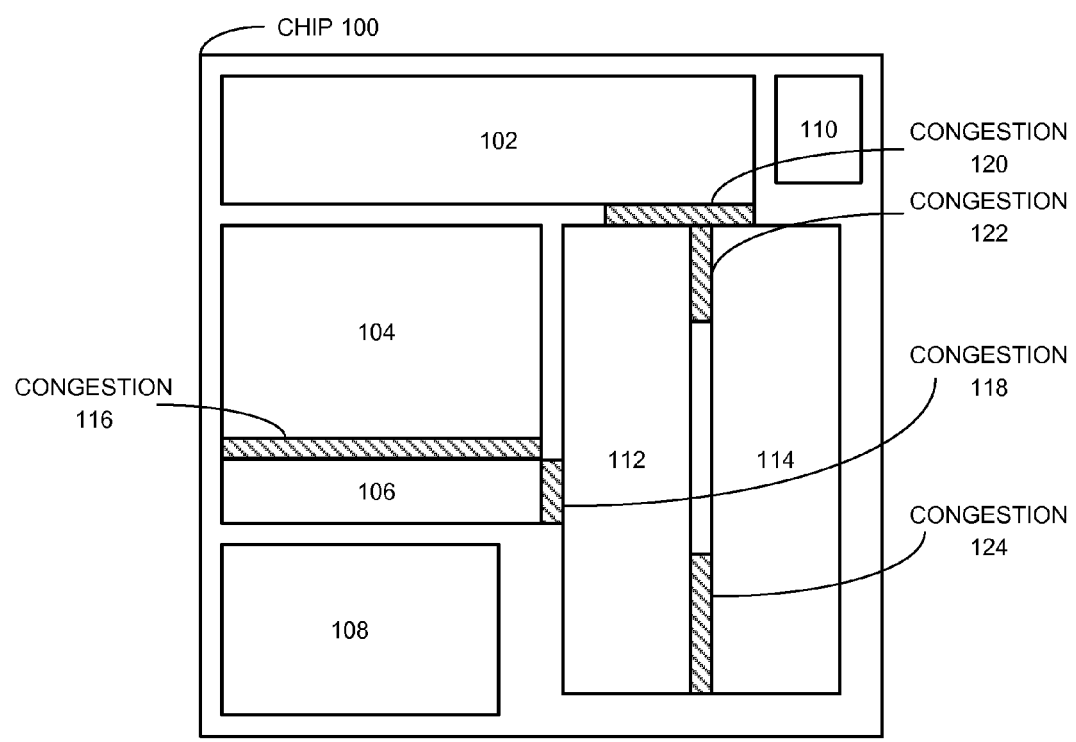
FIG. 1B illustrates an exemplary partitioning of a layout showing top-level channel congestion.
Figure 2A:
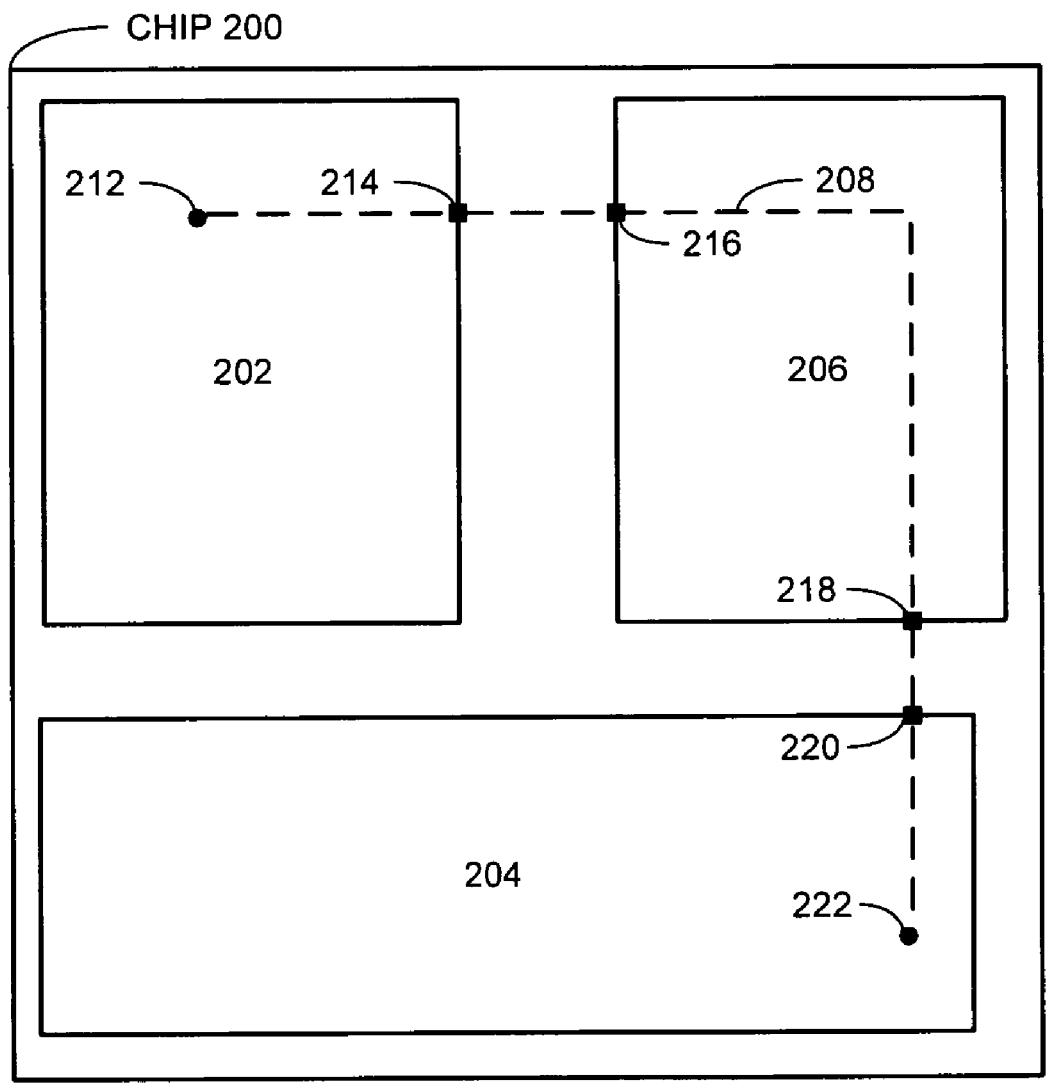
FIG. 2A illustrates a route for a net generated by a traditional global router prior to finalizing the hierarchical design.
Figure 2B:
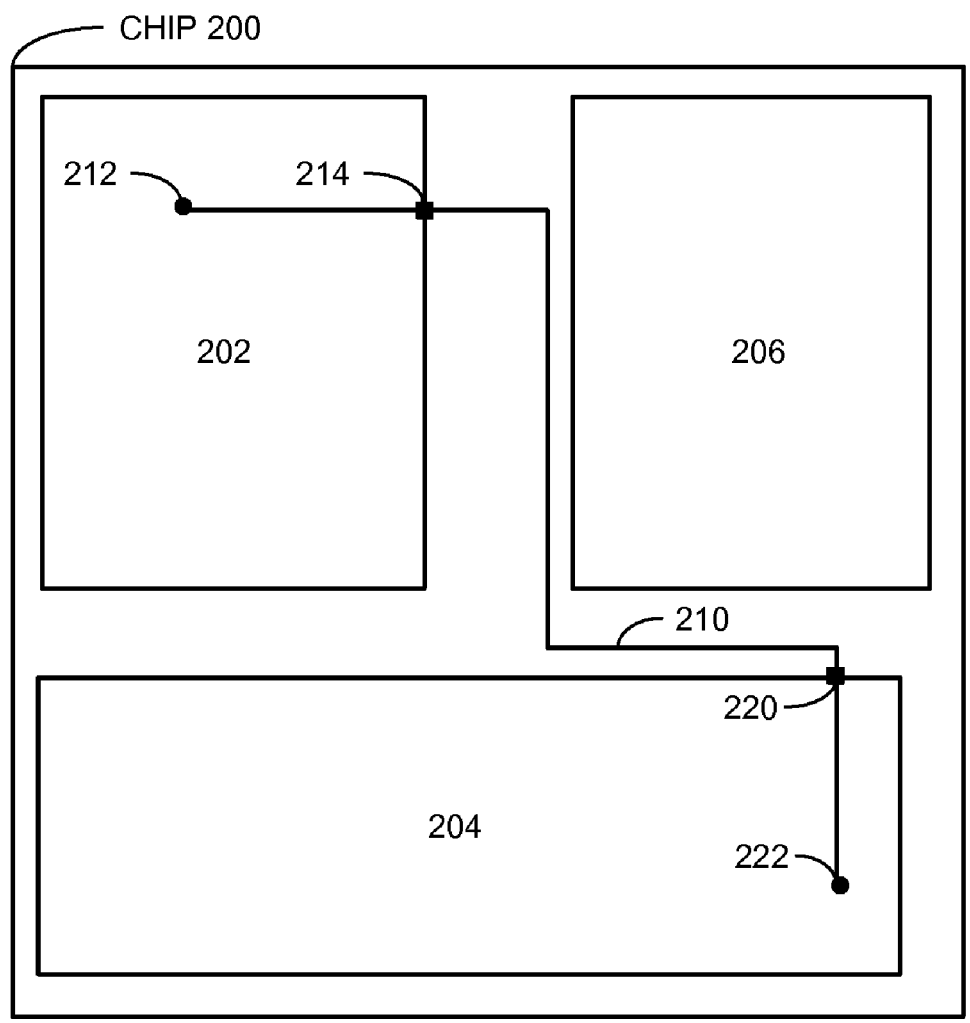
FIG. 2B illustrates a route for a net generated by a traditional global router after finalizing hierarchical design.
Figure 3:
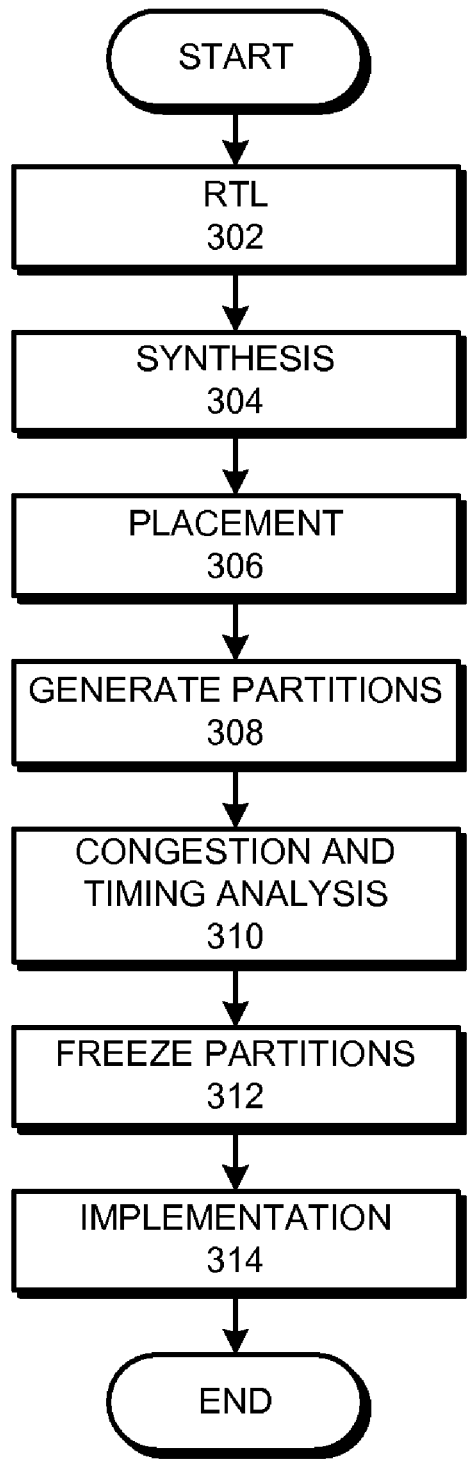
FIG. 3 presents a flow chart illustrating a typical hierarchical design process.

FIG. 3 presents a flow chart illustrating an typical hierarchical design process. The process begins when an IC designer writes register-transfer-level (RTL) code describing the function performed by an IC chip (step 302). Next, the IC designer performs synthesis on the RTL code to generate gates (step 304). The IC designer then generates an initial placement of the gates (step 306). Next, the IC designer either manually or automatically generates partitions (step 308), and performs congestion and timing analysis based on the partitioning (step 310). If there is no congestion and if there are no timing violations, the IC designer freezes the partitions (step 312). Finally, the IC designer implements the design (step 314).

The present invention operates between the generate partitions and congestion and timing analyses stages (steps 308 and 310). It routes nets in a similar manner as when the nets are routed in existing systems after finalizing the hierarchical design placement. The present invention uses information about the partition boundaries and feedthrough constraints to perform a global routing operation to predict whether there will be congestion or timing violations. Note that a feedthrough constraint restricts the routing of nets over the constrained area. Also note that the present invention detects congestion within a partition.

Figure 5:
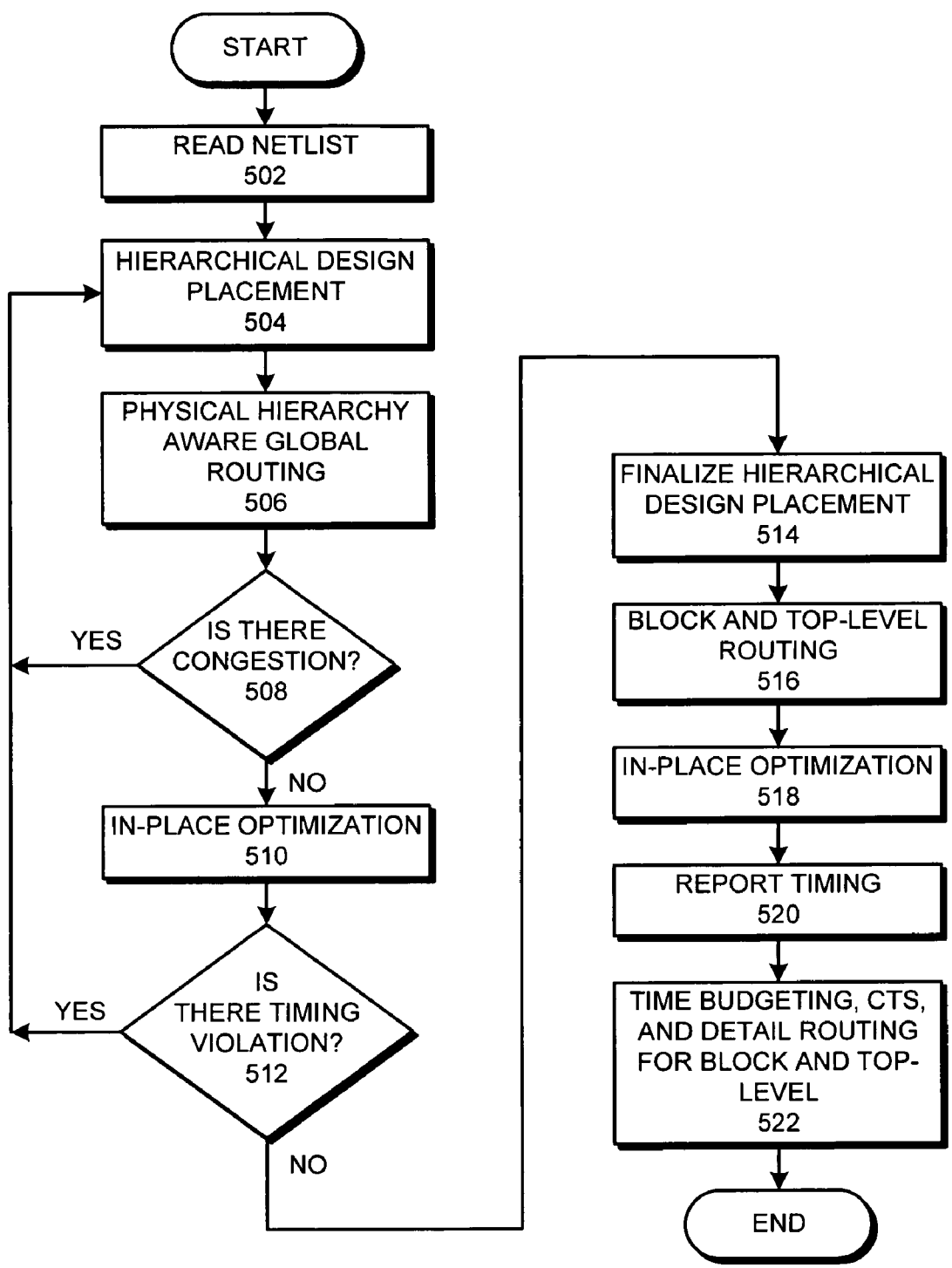
FIG. 5 presents a flow chart illustrating a hierarchical design flow using physical-hierarchy-aware global routing in accordance with an embodiment of the present invention.

FIG. 5 presents a flow chart illustrating a hierarchical design flow using physical-hierarchy-aware global routing in accordance with an embodiment of the present invention. The process begins when the system reads a netlist (step 502). Next, the system performs a hierarchical design placement (step 504), which involves placing cells and generating partitions. The system then performs physical-hierarchy-aware global routing (step 506), which respects partition boundaries and feedthrough constraints imposed by the initial hierarchical design placement and any manually imposed constraints by designer. Next, the system determines if there is any congestion (step 508). If so, the system returns to hierarchical design placement (step 504). Otherwise, the system performs in-place optimization (step 510). The system then checks for timing violations (step 512). If there are timing violations, the system returns to hierarchical design placement (step 504). Otherwise, the system finalizes the design placement (step 514). Note that pins are created at step 514 based on physical hierarchy aware global routing route-crossing locations at the physical partition boundaries.

Next, the system performs block and top-level routing (step 516). The system then performs in-place optimization (step 518) and reports timing (step 520). Finally, the system performs time budgeting, clock tree synthesis (CTS), and detailed block and top-level routing (step 522).

Figure 4:
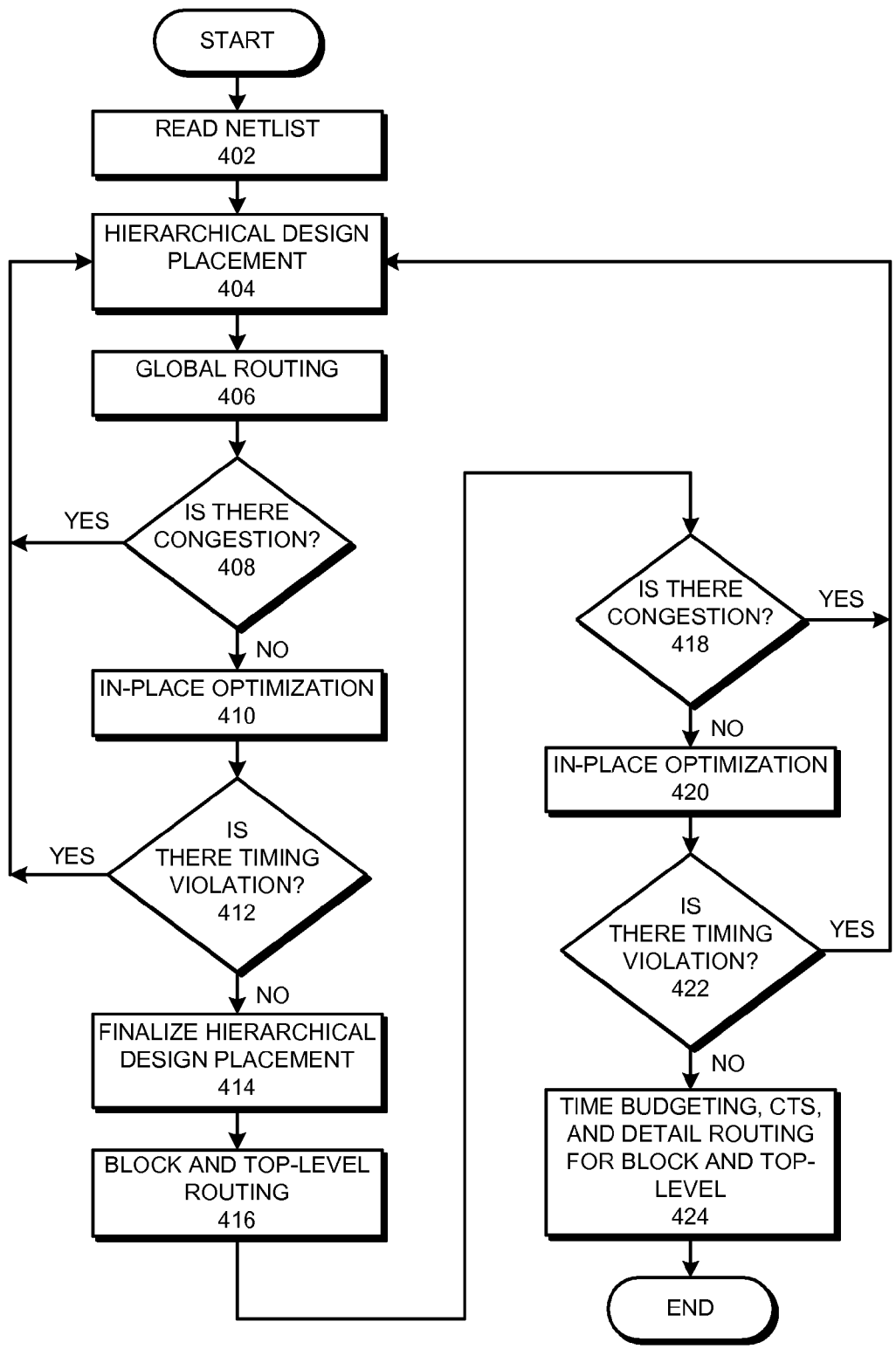
FIG. 4 presents a flow chart illustrating a traditional hierarchical design flow.

Note that unlike the process illustrated in FIG. 4, one embodiment of the present invention performs congestion and timing analysis before finalizing hierarchical design placement. Since the physical-hierarchy-aware global router accounts for partition boundaries and feedthrough constraints, the system can accurately predict congestion and timing violations during the initial hierarchical design stage and the IC designer can correct these violations before finalizing the hierarchical design placement.

Net Classification and Routing Constraints

Figure 6:
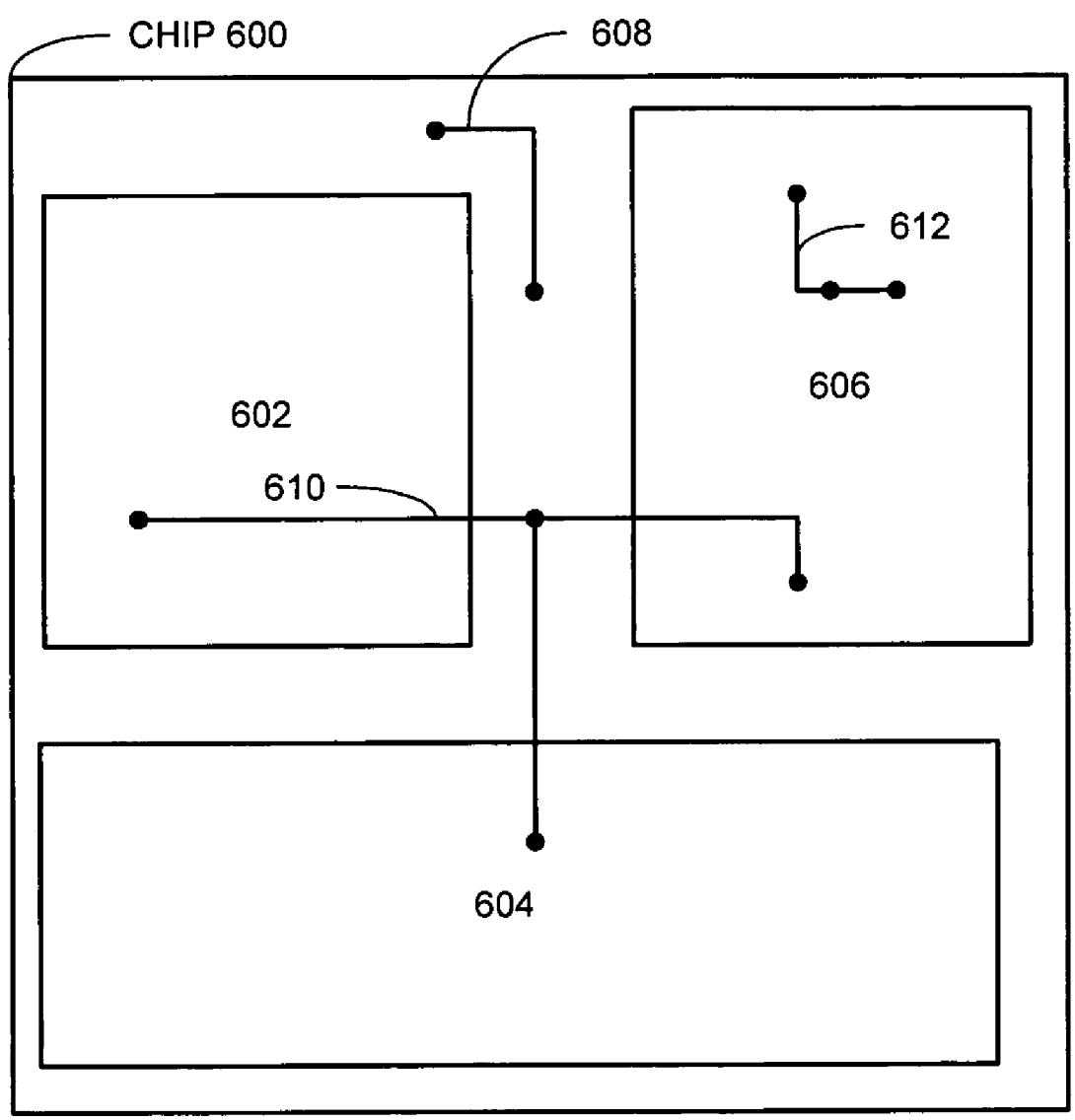
FIG. 6 illustrates the classification of nets in accordance with an embodiment of the present invention.

FIG. 6 illustrates the classification of nets in accordance with an embodiment of the present invention. It contains chip 600, partitions 602, 604, and 606, and nets 608, 610, 612. Net 608 is a top-level net, which is a net with all pins within top-level boundaries. Net 610 is a physical-partition-interface net, which is a net with at least one pin location in a different physical partition boundary than other pins. Here, net 610 exists in partitions 602, 604, and 606. Net 612 is a physical-partition-internal net, which is a net with all pin locations within partition boundaries. Note that a pin is a location where a net is coupled to leaf-level circuit elements within the integrated circuit.

The physical-hierarchy-aware global router uses these net classifications to constrain the routing of the net. The physical-hierarchy-aware global router determines if the net is a physical-partition-internal net, a top-level net, or a physical-partition-interface net. If the net is a physical-partition-internal net, the router ensures that the net remains within the block boundary of the physical partition. If the net is a top-level net, the router ensures that the net remains within the top-level physical partition boundary. For physical-partition-internal nets and top-level nets, the router creates a 2-D region within which a net must be routed. This 2-D region constraint is the same as the physical area of the partition in which intended net belongs. In one embodiment of the present invention, the router dynamically blocks out regions outside this 2-D area.

If the net is a physical-partition-interface net. The router orders the pins and partitions the pins of the physical-partition-interface nets such that each pin is in a subset of pins, wherein after routing each subset of pins, the resulting net is a physical-partition-internal net or a top-level net. The router routes each subset of pins to form a subset of nets. Note that each pin in the subset belongs to one physical partition or top-level area. Also note that each pin belongs to only one subset. The router routes the subset of nets to each other such that the number of crossings on the physical partition boundary equals the number of logical ports on the physical partition boundary. Note that routing each subset of pins involves routing the pins based on whether the net is a physical-partition-internal net or a top-level net.

Figure 7A:
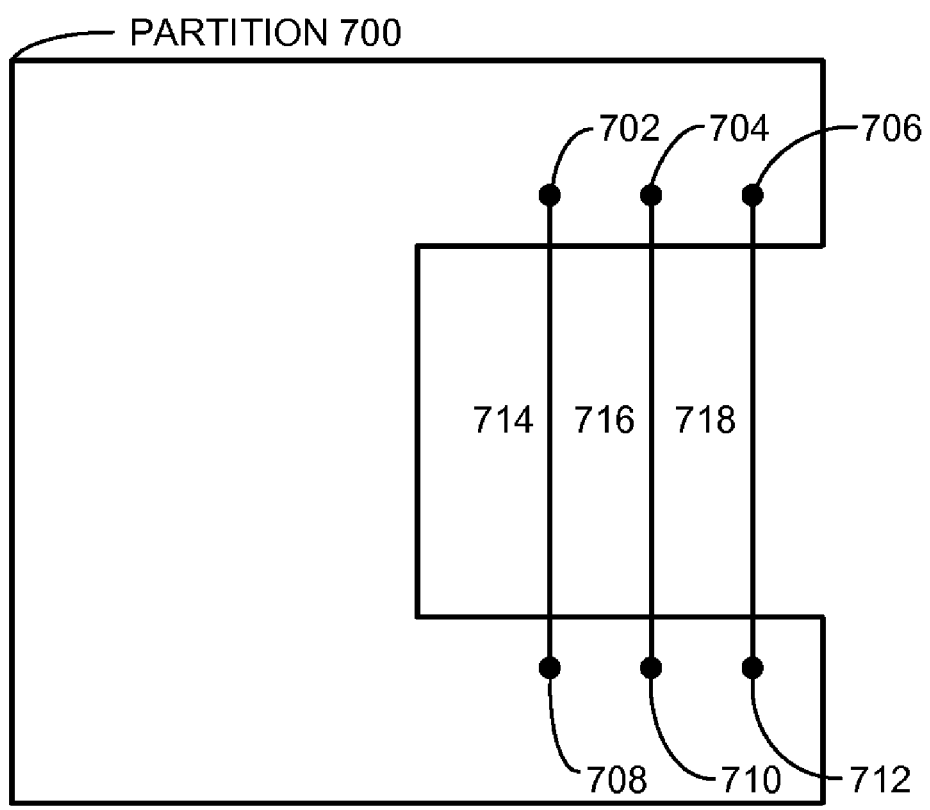
FIG. 7A illustrates routing of physical-partition-internal-nets using a traditional hierarchical design flow.

FIG. 7A illustrates routing of physical-partition-internal nets using a traditional hierarchical design flow (using a traditional global router). It contains partition 700, leaf-level pins 702, 704, 706, 708, 710, and 712, and nets 714, 716, and 718. Leaf-level pins 702, 704, 706, 708, 710, and 712 all exist within partition 700, and therefore, the resulting nets should be routed within partition 700. During the initial hierarchical design stage, a traditional global router, without knowledge of the partition boundaries and net classification, routes nets 714, 716, and 718 outside of partition 700.

Figure 7B:
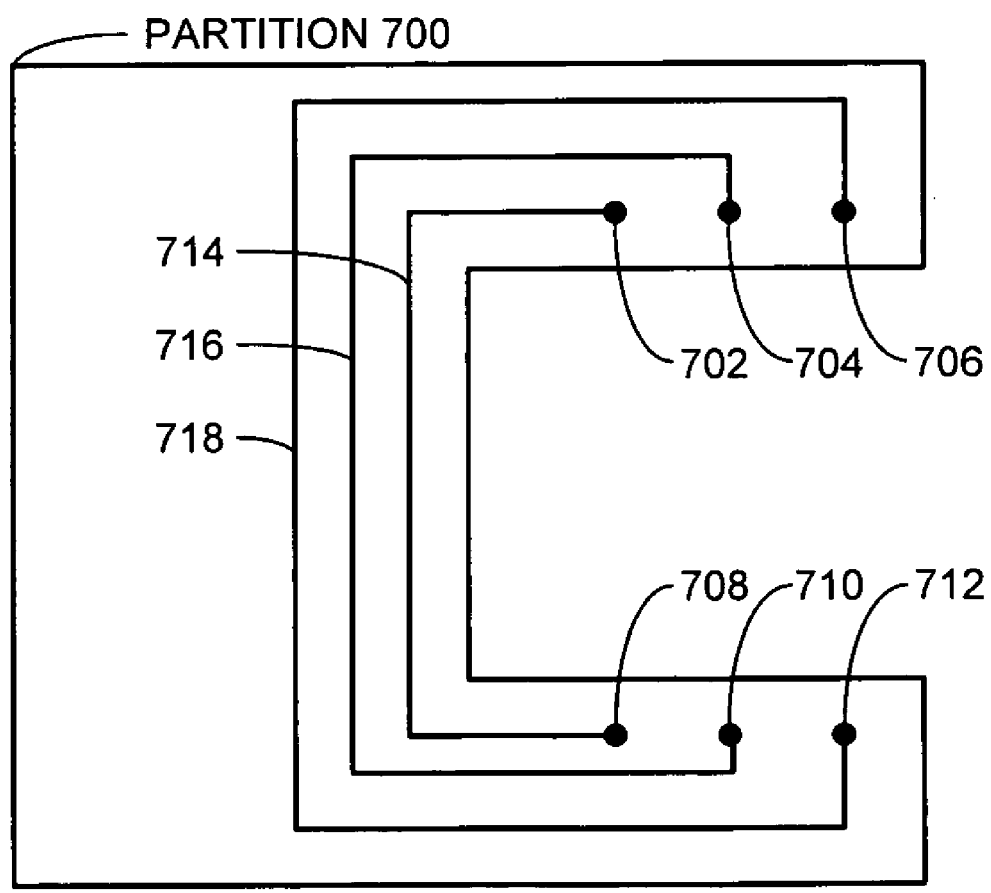
FIG. 7B illustrates routing of physical-partition-internal-nets using a physical-hierarchy-aware global routing design flow in accordance with an embodiment of the present invention.

FIG. 7B illustrates routing of physical-partition-internal-nets using a physical-hierarchy-aware global routing design flow in accordance with an embodiment of the present invention. It contains the same elements as FIG. 7B but instead of routing nets 714, 716, and 718 outside of partition 700, the physical-hierarchy-aware router routes these nets within the partition boundary.

Figure 8A:
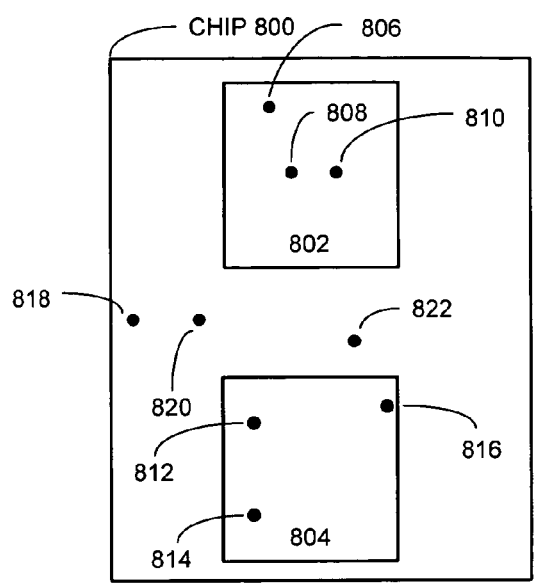
FIG. 8A illustrates an exemplary layout of pins in accordance with an embodiment of the present invention.

FIG. 8A illustrates an exemplary layout of pins in accordance with an embodiment of the present invention. It contains chip 800, partitions 802 and 804, and leaf-level pins 806, 808, 810, 812, 814, 816, 818, 820, and 822. Leaf-level pins 806, 808, and 810 are located within partition 802. Leaf-level pins 812, 814, and 816 are located within partition 804. Leaf-level pins 818, 820, and 822 are located in the top-level channel outside of partitions 802 and 804.

When routing physical-partition-interface nets, the physical-hierarchy-aware global router first separately connects the pins within each partition to form physical-partition-internal nets. The resulting nets are subnets of the physical-partition-interface net being routed. Note that the router also routes pins in the top-level channels to form top-level nets. The router then connects these subnets together.

Figure 8B:
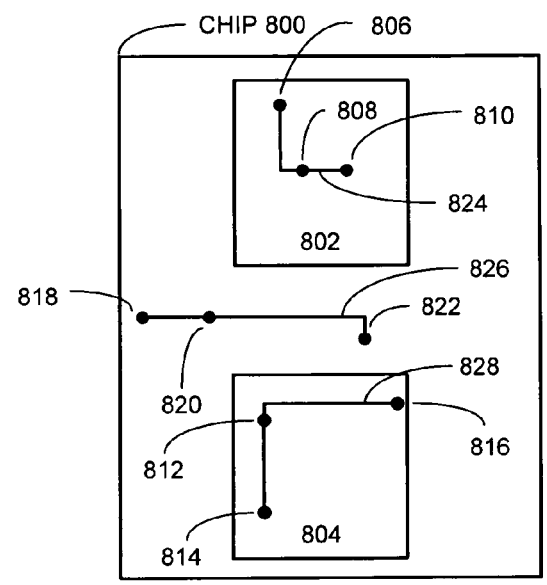
FIG. 8B illustrates an exemplary routing of subnets in accordance with an embodiment of the present invention.

FIG. 8B illustrates an exemplary routing of subnets in accordance with an embodiment of the present invention. It contains the same elements as FIG. 8A as well as physical-partition-internal nets 824 and 828, and top-level net 826. In FIG. 8B, the physical-hierarchy-aware global router first separately connects the pins within each partition and in the top-level channels to form physical-partition-internal nets 824 and 828 and top-level net 826, respectively.

Figure 8C:
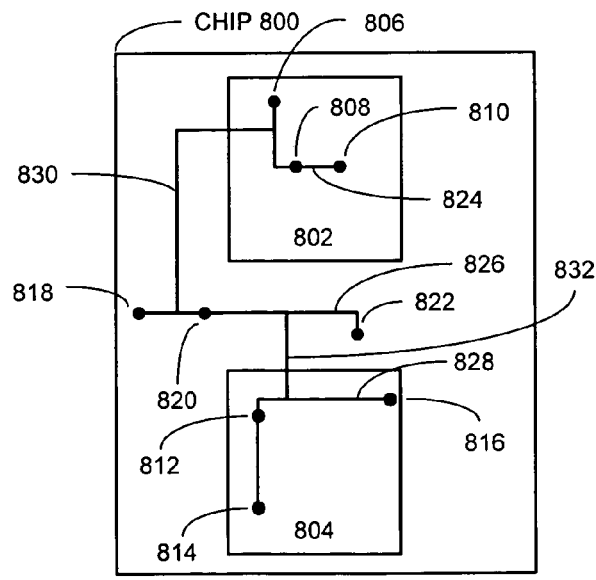
FIG. 8C illustrates an exemplary routing of subnets in accordance with an embodiment of the present invention.

FIG. 8C illustrates an exemplary routing of subnets in accordance with an embodiment of the present invention. It contains the same elements as in FIG. 8B as well as nets 830 and 832. In this figure, the physical-hierarchy-aware global router connects the subnets together to form the physical-partition-interface net.

Figure 9:
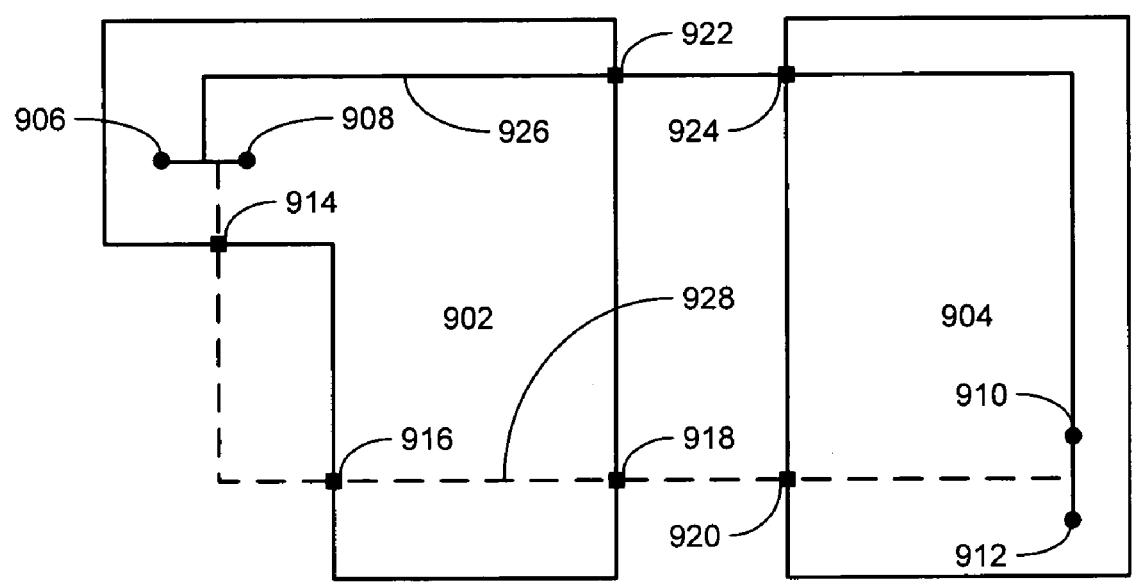
FIG. 9 illustrates an exemplary routing of physical-partition-interface nets in accordance with an embodiment of the present invention.

Note that the physical-hierarchy-aware global router attempts to keep the logical pin count equal to the physical pin count. FIG. 9 illustrates an exemplary routing of physical-partition-interface nets in accordance with an embodiment of the present invention. It contains partitions 902 and 904, leaf-level pins 906, 908, 910, 912, partition boundary crossing 914, 916, 918, 920, 922, 924, and nets 926 and 928. Since the circuit elements in partition 902 and 904 communicate with each other, one logical pin exists at the partition boundaries for the net connecting between these two circuit elements. Note that this net is a physical-partition-interface net. Note that a traditional global router operating during the initial hierarchical design stage does not enforce the constraint that the number of logical pins for the physical-partition-interface net equals the number of crossings on the partition boundary. Therefore, the traditional global router generates net 928, which crosses the boundary of partition 902 three times. In contrast, the physical-hierarchy-aware global router generates net 926, which only crosses each of partitions 902 and 904 once.

Figure 10:
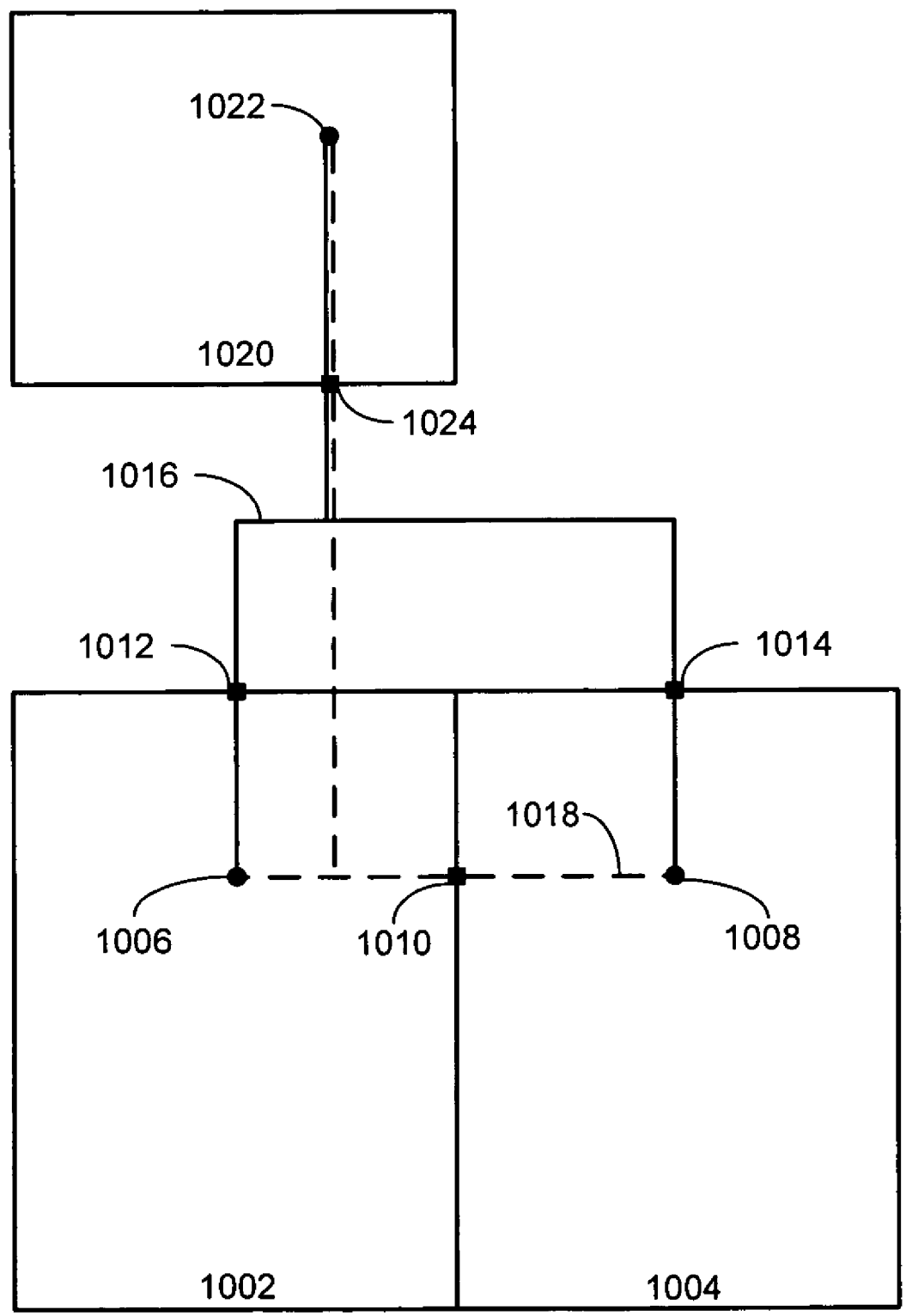
FIG. 10 illustrates an exemplary routing of physical-partition-interface nets with feedthrough constraints in accordance with an embodiment of the present invention.

FIG. 10 illustrates an exemplary routing of physical-partition-interface nets with feedthrough constraints in accordance with an embodiment of the present invention. It contains partitions 1002, 1004, and 1020, leaf-level pins 1006, 1008, and 1022, partition boundary crossings 1010, 1012, and 1014, and 1024, and nets 1016 and 1018. Partition 1004 has a feedthrough restriction which does not allow nets to be routed through the partition. Leaf-level pins 1006, 1008, and 1022 need to be connected together. A traditional global router operating during the initial hierarchical design stage does not account for the feedthrough constraint during the initial hierarchical design stage and therefore connects leaf-level pins 1006, 1008, and 1022 using net 1018. Note that net 1018 violates the feedthrough constraint imposed by partition 1004. In contrast, the physical-hierarchy-aware global router respects the feedthrough constraint during the initial hierarchical design stage and therefore connects leaf-level pins 1006, 1008, and 1022 using net 1016. Note that net 1016 first exits partition 1002 at partition boundary crossing 1012 into the top-level channel and then reenters partition 1004 at partition boundary crossing 1014.

Note that feedthrough constraints can be applied to partitions and to specific nets. If the feedthrough constraints are applied to both partitions or to specific nets, prior to routing net, then router sets up the feedthrough blockages for each net. The router then routes the nets while respecting the feedthrough blockages.

Figure 11A:
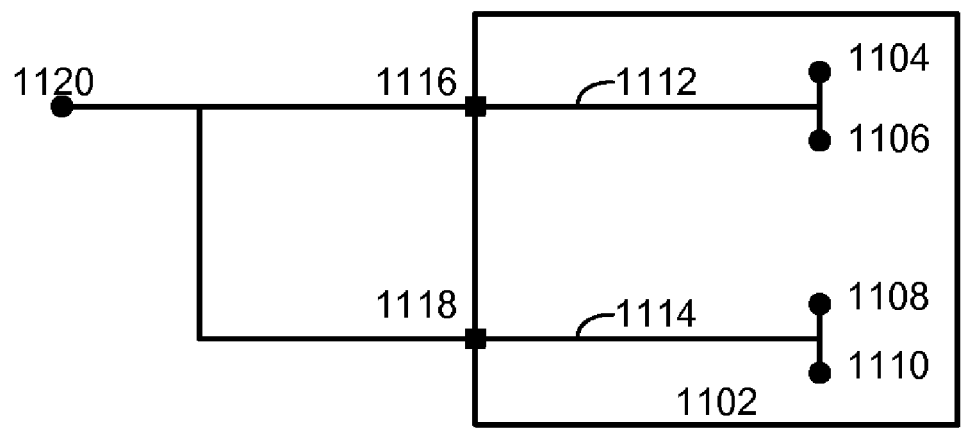
FIG. 11A illustrates an exemplary logical connection of nets.

FIG. 11A illustrates an exemplary logical connection of nets. It contains partition 1102, leaf-level pins 1104, 1106, 1108, 1110, and 1120, nets 1112 and 1114, and partition boundary crossings 1116 and 1118. At the logic level, the logic contained within partition 1102 has two input/output pins, represented by partition boundary crossings 1116 and 1118, which are then connected together at the top level.

Figure 11B:
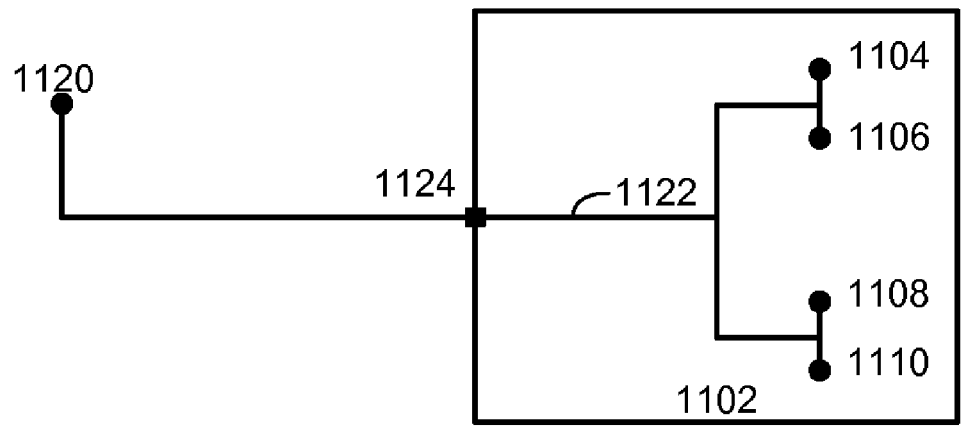
FIG. 11B illustrates an exemplary routing of subnets using a traditional global router.

FIG. 11B illustrates an exemplary routing of subnets using a traditional global router. It contains partition 1102, leaf-level pins 1104, 1106, 1108, 1110, 1120, net 1122, and partition crossing 1124. A traditional global router operating during the initial hierarchical design stage flattens the hierarchical design and realizes that leaf-level pins 1104, 1106, 1108, 1110, and 1120 in FIG. 11A connect together at the top-level. Instead of connecting those leaf-level pins at the top-level, the traditional global router makes the connection within partition 1102 and crosses partition 1102 once at partition crossing 1124.

Figure 11C:
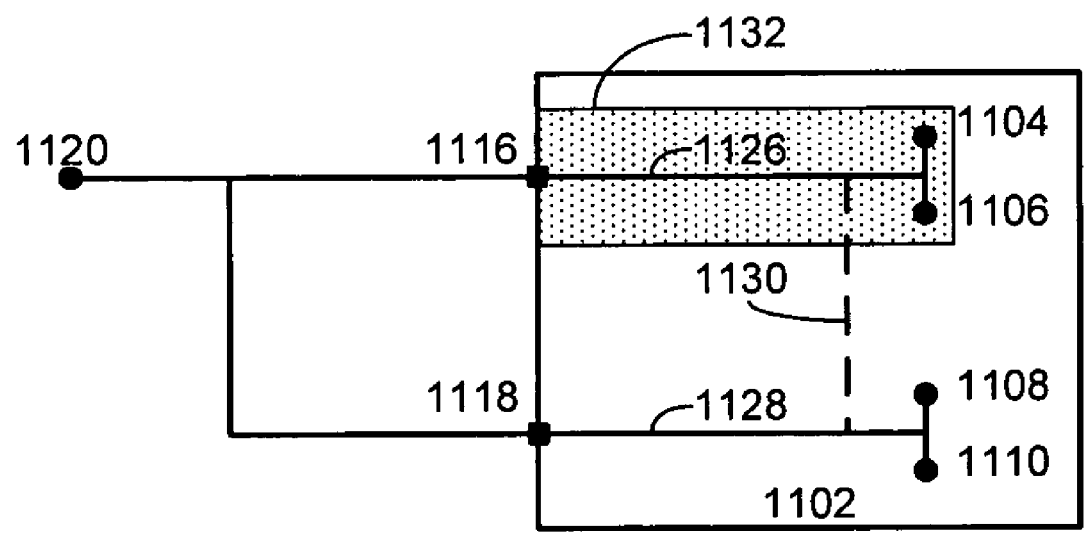
FIG. 11C illustrates an exemplary routing of subnets using a physical-hierarchy-aware global router in accordance with an embodiment of the present invention.

FIG. 11C illustrates an exemplary routing of subnets using a physical-hierarchy-aware global router in accordance with an embodiment of the present invention. It contains partition 1102, leaf-level pins 1104, 1106, 1108, 1110, and 1120, partition crossings 1116 and 1118, nets 1126, 1128, and 1130, and routing block 1132. In order to preserve the logical pin count and partition crossing count, the physical-hierarchy-aware global router first connects leaf-level pins 1104 and 1106 to leaf-level pin 1120 using net 1126. The router then creates routing block 1132 when connecting leaf-level pins 1108 and 1110 to 1120. The routing block covers net 1126 and prevents the router from connecting leaf-level pins 1108 and 1110 using net 1130. Instead, the router uses net 1128 to connect leaf-level pins 1108 and 1110 to leaf-level pin 1120.

Note that the reason the router need to preserve the logical pin count is because partition 1102 may be a cell which is instantiated multiple times. Using the same layout instance with the same pin locations and internal layout simplifies the design process because the IC designer does not need to create a new cell. Instead, the IC designer can use the same cell, making the necessary connections at the top-level. Another reason to preserve the logical pin count is to facilitate logical to physical verification of a cell. If the logical pin count is different from the physical pin count, then logical to physical verification of cell will fail.

Note that hierarchical pins on physical partition boundaries do not exist at the early stages in the design process. Physical hierarchy aware global routing routes will cross physical partition boundaries for interface nets. These crossing locations will become hierarchical pin locations when hierarchical design placement is finalized. Thus, physical hierarchy aware global routing produces optimal pin physical partition pin locations.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for routing nets within an integrated circuit, comprising:
receiving a representation for the integrated circuit, wherein the representation includes block boundaries for physical partitions of the integrated circuit generated from a hierarchical design placement of the integrated circuit;
classifying each net in the integrated circuit based on location of pins associated with the net, wherein the pins are locations where the net is coupled to circuit elements or block boundaries within the integrated circuit;

generating routing constraints for each net based on the classification of the net;

applying a feedthrough constraint to the physical partitions, wherein the feedthrough constraint restricts nets from feeding through physical partition boundaries; and routing each net using the routing constraints for the net and the feedthrough constraints for the physical partitions;

wherein routing each net using the routing constraints involves:

determining if the net is a physical-partition-interface net; and if so:

partitioning the pins of the physical-partition-interface nets such that each pin is in a subset of pins, wherein after routing each subset of pins, the resulting net is: a physical-partition-internal net or a top-level net; and routing each subset of pins to form a subset of nets; and wherein routing is performed based on the block boundaries prior to finalizing the hierarchical design placement, thereby facilitating early detection of congestion or timing violations which can be corrected early in the design process.

2. The method of claim 1, wherein classifications for the net include:

a physical-partition-internal net, wherein all pin locations for the net are within a block boundary of the physical partition;

a top-level net, wherein all pin locations for the net are within a top-level physical partition boundary; and a physical-partition-interface net, wherein at least one pin location for the net is located in a different physical partition boundary than other pins for the net.

3. The method of claim 1, wherein routing each net using the routing constraints further involves:

determining if the net is a physical-partition-internal net, a top-level net, or a physical-partition-interface net;

if the net is a physical-partition-internal net, routing the net so that the net remains within the block boundary of the physical partition;

if the net is a top-level net, routing the net so that the net remains within the top-level physical partition boundary; and if the net is a physical-partition-interface net, the method further comprises:

routing the subset of nets to each other such that the number of crossings on the physical partition boundary equals the number of logical ports on the physical partition boundary;

wherein routing each subset of pins involves routing the pins based on whether the net is a physical-partition-internal net or a top-level net.

4. The method of claim 1, wherein the feedthrough constraint prevents routing nets through part of or all of the physical partition; and wherein the feedthrough constraint only applies to top-level nets and interface nets.

5. The method of claim 1, further comprising applying the feedthrough constraint to all nets, not just top-level nets and physical-partition-interface nets.

6. The method of claim 1, wherein after routing the nets, the method further comprises:

determining if there is wire congestion in the current design for the integrated circuit;

determining if there are timing violations in the current design for the integrated circuit;

if there is wire congestion or if there are timing violations, generating a new floorplan, a new hierarchical design placement, and new block boundaries for physical partitions; and rerouting the nets using the new block boundaries for physical partitions.

7. An apparatus for routing nets within an integrated circuit, comprising:

a router;

wherein the router is configured to:

receive a representation for the integrated circuit, wherein the representation includes block boundaries for physical partitions of the integrated circuit generated from a hierarchical design placement of the integrated circuit;

classify each net in the integrated circuit based on location of pins associated with the net, wherein the pins are locations where the net is coupled to circuit elements or block boundaries within the integrated circuit;

generate routing constraints for each net based on the classification of the net;

apply a feedthrough constraint to the physical partitions, wherein the feedthrough constraint restricts nets from feeding through physical partition boundaries; and to route each net using the routing constraints for the net and the feedthrough constraints for the physical partitions;

wherein routing each net using the routing constraints involves:

determining if the net is a physical-partition-interface net; and if so:

partitioning the pins of the physical-partition-interface nets such that each pin is in a subset of pins, wherein after routing each subset of pins, the resulting net is: a physical-partition-internal net or a top-level net; and routing each subset of pins to form a subset of nets; and wherein routing is performed based on the block boundaries prior to finalizing the hierarchical design placement, thereby facilitating early detection of congestion or timing violations which can be corrected early in the design process.

8. The apparatus of claim 7, wherein classifications for the net include:

a physical-partition-internal net, wherein all pin locations for the net are within a block boundary of the physical partition;

a top-level net, wherein all pin locations for the net are within a top-level physical partition boundary; and a physical-partition-interface net, wherein at least one pin location for the net is located in a different physical partition boundary than other pins for the net.

9. The apparatus of claim 7, wherein in order to route each net using the routing constraints, the router is further configured to:

determine if the net is a physical-partition-internal net, a top-level net, or a physical-partition-interface net;

if the net is a physical-partition-internal net, to route the net so that the net remains within the block boundary of the physical partition;

if the net is a top-level net, to route the net so that the net remains within the top-level physical partition boundary; and if the net is a physical-partition-interface net, the router is further configured to:

route the subset of nets to each other such that the number of crossings on the physical partition boundary equals the number of logical ports on the physical partition boundary;

wherein routing each subset of pins involves routing the pins based on whether the net is a physical-partition-internal net or a top-level net.

10. The apparatus of claim 7, wherein the feedthrough constraint prevents routing nets through part of or all of the physical partition; and wherein the feedthrough constraint only applies to top-level nets and interface nets.

11. The apparatus of claim 7, wherein the router is configured to apply the feedthrough constraint to all nets, not just top-level nets and physical-partition-interface nets.

12. The apparatus of claim 7, wherein after routing the nets, the router is configured to:

determine if there is wire congestion in the current design for the integrated circuit;

determine if there are timing violations in the current design for the integrated circuit;

if there is wire congestion or if there are timing violations, to generate a new floorplan, a new hierarchical design placement, and new block boundaries for physical partitions; and reroute the nets using the new block boundaries for physical partitions.

13. A computer system for routing nets within an integrated circuit, comprising:

a router;

wherein the router is configured to:

receive a representation for the integrated circuit, wherein the representation includes block boundaries for physical partitions of the integrated circuit generated from a hierarchical design placement of the integrated circuit;

classify each net in the integrated circuit based on location of pins associated with the net, wherein the pins are locations where the net is coupled to circuit elements or block boundaries within the integrated circuit;

generate routing constraints for each net based on the classification of the net;

apply a feedthrough constraint to the physical partitions, wherein the feedthrough constraint restricts nets from feeding through physical partition boundaries; and to route each net using the routing constraints for the net and the feedthrough constraints for the physical partitions;

wherein routing each net using the routing constraints involves;

determining if the net is a physical-partition-interface net; and if so:

partitioning the pins of the physical-partition-interface nets such that each pin is in a subset of pins, wherein after routing each subset of pins, the resulting net is: a physical-partition-internal net or a top-level net; and routing each subset of pins to form a subset of nets; and wherein routing is performed based on the block boundaries prior to finalizing the hierarchical design placement, thereby facilitating early detection of congestion or timing violations which can be corrected early in the design process.

14. The computer system of claim 13, wherein classifications for the net include:

a physical-partition-internal net, wherein all pin locations for the net are within a block boundary of the physical partition;

a top-level net, wherein all pin locations for the net are within a top-level physical partition boundary; and a physical-partition-interface net, wherein at least one pin location for the net is located in a different physical partition boundary than other pins for the net.

15. The computer system of claim 13, wherein in order to route each net using the routing constraints, the router is further configured to:

determine if the net is a physical-partition-internal net, a top-level net, or a physical-partition-interface net;

if the net is a physical-partition-internal net, to route the net so that the net remains within the block boundary of the physical partition;

if the net is a top-level net, to route the net so that the net remains within the top-level physical partition boundary; and if the net is a physical-partition-interface net, the router is further configured to:

route the subset of nets to each other such that the number of crossings on the physical partition boundary equals the number of logical ports on the physical partition boundary;

wherein routing each subset of pins involves routing the pins based on whether the net is a physical-partition-internal net or a top-level net.

16. The computer system of claim 13, wherein the feedthrough constraint prevents routing nets through part of or all of the physical partition; and wherein the feedthrough constraint only applies to top-level nets and interface nets.

17. The computer system of claim 13, wherein the router is configured to apply the feedthrough constraint to all nets, not just top-level nets and physical-partition-interface nets.

18. The computer system of claim 13, wherein after routing the nets, the router is configured to:

determine if there is wire congestion in the current design for the integrated circuit;

determine if there are timing violations in the current design for the integrated circuit;

if there is wire congestion or if there are timing violations, to generate a new floorplan, a new hierarchical design placement, and new block boundaries for physical partitions; and reroute the nets using the new block boundaries for physical partitions.

* * * * *